United States Patent [19]

Sakai

[11] Patent Number: 5,043,757
[45] Date of Patent: Aug. 27, 1991

[54] IMAGE FORMING APPARATUS USING HEAT-SOFTENING MICROCAPSULES

[75] Inventor: Jun Sakai, Nagoya, Japan
[73] Assignee: Brother Kogyo Kabushiki Kaisha, Japan
[21] Appl. No.: 497,990
[22] Filed: Mar. 23, 1990
[30] Foreign Application Priority Data
Apr. 20, 1989 [JP] Japan ................. P1-100690
[51] Int. Cl.5 ............................. G03B 27/52
[52] U.S. Cl. .................................... 355/27
[58] Field of Search .................. 355/27–29, 355/100, 106; 430/138, 211

[56] References Cited

U.S. PATENT DOCUMENTS 4,801,949 1/1989 Misono et al. ............... 355/100
4,943,509 7/1990 Sakai et al. ................. 430/138

FOREIGN PATENT DOCUMENTS 2201803 9/1988 United Kingdom .

Primary Examiner—Brian W. Brown
Assistant Examiner—D. Rutledge
Attorney, Agent, or Firm—Oliff & Berridge

[57] ABSTRACT

An image forming apparatus for forming visible images on a recording medium according to source image information, comprises microcapsules, a stirring roller, a photosensitive drum, a microcapsules coating device, a corotron, an exposing device, a heater and a developing device. Each of the microcapsules includes a chromogenic material and a material having a heat-softening property wherein it is softened by heat and a photocuring property wherein it is cured by light. The stirring roller frictionally charges the microcapsules. The photosensitive drum has an electrically chargeable drum surface, the drum surface permits electrostatic latent image to be formed therein according to the source image information. The microcapsules coating device coates the charged microcapsules onto the drum surface of the photosensitive drum according to the electrostatic latent images. The corotron transfer the microcapsules from the drum surface of the photosensitive drum to the recording medium. The exposing device exposes the microcapsules to a radiation having the source image information, so as to selectively cure the microcapsules according to the source image information. The heater heads the microscapsules so as to soften the microscapsules before the microcapsules the pressed by the developing device. The developing device presses the recording medium so as to rupture the softened microcapsules on the recording medium, whereby the visible images are formed on the recording medium.

26 Claims, 3 Drawing Sheets

IMAGE FORMING APPARATUS USING HEAT-SOFTENING MICROCAPSULES

BACKGROUND OF THE INVENTION

1. Field of the Invention

The present invention relates to an image forming apparatus employing microcapsules.

2. Discussion of Related Art

There has been proposed in Japanese Patent Application No. 63-320242 which corresponds to U.S. Patent Application No. Ser. No. 07/451,238 filed Dec. 15, 1989 and assigned to the same assignee as the present application, an image forming apparatus capable of forming an image on an ordinary cut sheet.

This apparatus is designed so as to coat microcapsules and a developer material directly onto a plain paper and thereafter carry out exposure and development. In this apparatus, the microcapsules can be electrostatically coated at a necessary position of the ordinary cut sheet by using a xerographic technique.

However, the above apparatus cannot utilize the most inexpensive frictional electrification for charging of the microcapsules since the microcapsules are in a soft condition at ordinary temperature and they would therefore be ruptured if frictionally charged.

Such undue rupture of the microcapsules is a serious problem since it hinders the formation of images. Further, undue rupture of the microcapsules has sometimes occurred in storage, replenishment, transportation, etc.

SUMMARY OF THE PRESENT INVENTION

An object of the present invention is to provide an image forming apparatus which can utilize normally hardened microcapsules to thereby prevent undue rupture of the microcapsules. To achieve the object, an image forming apparatus according to the present invention is arranged as shown to include the following: microcapsules each of which includes a coloring material and a material having a heat-softening property wherein it is cured by light; a coating device for coating the microcapsules onto the recording medium; an exposing device for exposing the microcapsules to a radiation having source image information, so as to selectively cure the microcapsules according to the source image information; a heating device for heating the microcapsules so as to soften the microcapsules; and a pressure developing device for pressing the recording medium so as to rupture the softened microcapsules on the recording medium, whereby the visible images are formed on the recording medium.

BRIEF DESCRIPTION OF THE DRAWINGS

A preferred embodiment of the present invention will be described in detail with reference to the following figures wherein.

DETAILED DESCRIPTION OF THE PREFERRED EMBODIMENTS

Figure 1:
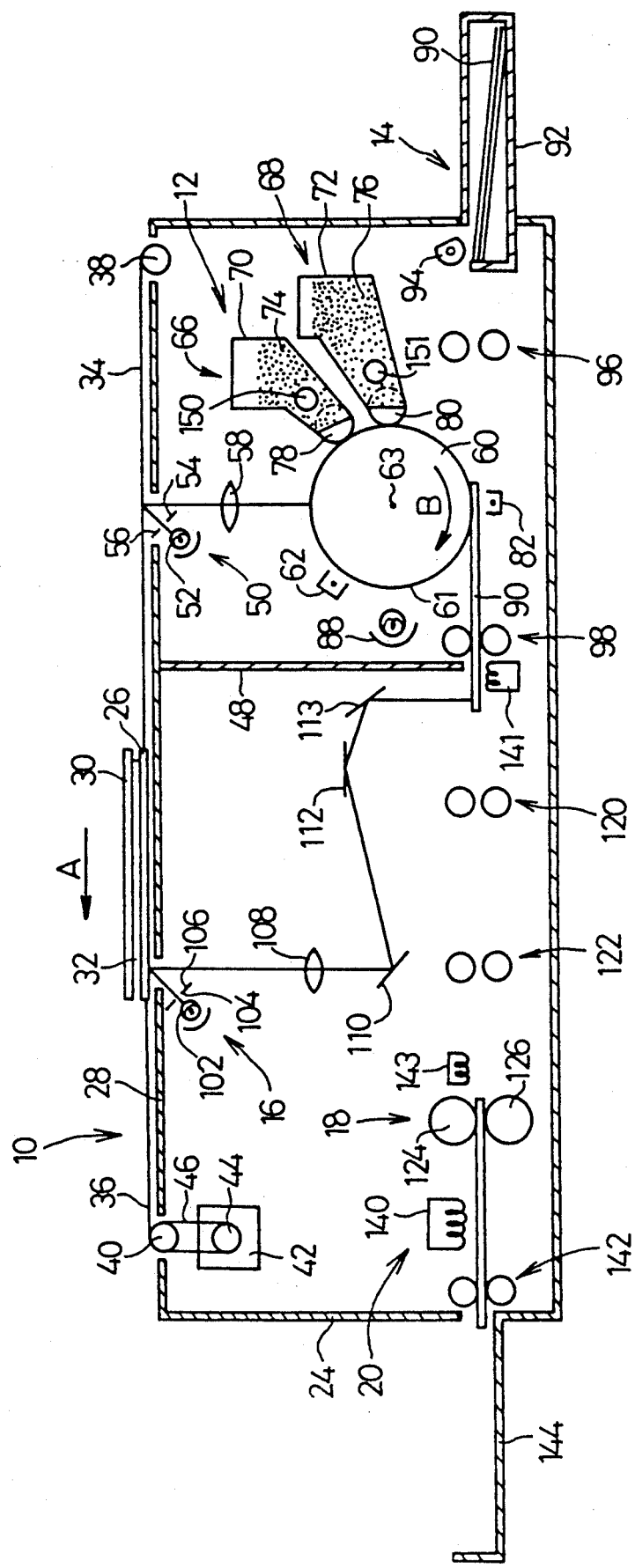
FIG. 1 is a schematic view of a copying machine embodying the present invention.

Referring first to FIG. 1, there is illustrated a copying machine embodying the present invention. The copying machine includes an original displacing device 10 for displacing an original, a coating device 12, a sheet feeding device 14, an exposing device 16, a developing device 18, and a fixing device 20.

The original displacing device 10 for displacing a color-image original 32 bearing source image information or color images, is provided at the top of a housing 24 of the copying machine. The original displacing device 10 includes a support 26 on which the original 32 is set. The support 26 is formed of a colorless transparent material, such as glass, which transmits light or radiation. The support 26 is disposed on a top wall 28 of the housing 24 such that the support 26 is displaceable in rightward and leftward directions as viewed in FIG. 1. The original displacing device 10 further includes a cover 30 for covering the original 32 set on the support 26. Wires 34, 36 are connected at one of their ends to the right-hand and left-hand ends of the support 26, respectively, and are wound at their other ends around pulleys 38, 40, respectively. The pulleys 38, 40 are rotatably supported by the housing 24. The pulley 40 is located on the downstream side of the pulley 38 as viewed in the leftward direction indicated at A in FIG. 1. Hereinafter the direction "A" is referred to as the "copying" direction, and a direction opposite to the direction "A" is referred to as the "reverse" direction. The pulley 40 is coupled via a belt 46 to a pulley 44 secured to an output shaft of a drive motor 42. The drive motor 42 drives or rotates the pulley 40 and thereby displaces the support 26 in the copying direction. Meanwhile, the pulley 38 is biased by a biasing device (not shown) to rotate in a direction causing taking-up of the wire 34 and thereby displacing the support 26 in the reverse direction opposite to the copying direction. Accordingly, when the drive motor 42 is rotated in a direction opposite to the direction causing the displacement of the support 26 in the copying direction, the support 26 is returned in the reverse direction toward its start position, where the displacement of the support 26 in the copying direction commences.

Space inside the housing 24 is separated by a partition wall 48 into an upstream-side section and a downstream-side section as viewed in the copying direction. The coating device 12 is provided in the upstream-side section. The coating device 12 includes an exposing means 50 including a lamp 52 serving as a light source. The lamp 52 has an elongate shape, and its longitudinal axis extends in a transverse direction perpendicular to the copying direction. The lamp 52 irradiates an irradiation zone on an imaged surface of the original 32 through a slit 54 formed through a screen 56 provided in front of the lamp 52. The original color images have a color or colors different from the background or base color, namely, color of the paper of the original 32. The slit 54 has a predetermined width, and extends in parallel to the longitudinal axis of the lamp 52. Thus, the irradiation zone irradiated by the lamp 52 has a suitable width, and extends in a transverse direction perpendicular to the copying direction. The light beams or images reflected from the original 32 are converged by a lens 58 on an outer circumferential surface 61 of a photosensitive drum 60 serving as an electrostatic body. The drum 60 is disposed directly beneath the lens 58. Thus, the exposing means 50 exposes an exposure zone at the top of the outer surface 61 of the drum 60 as the drum 60 is rotated about its axis 63. The exposure zone has a suitable width, and extends in parallel to the rotation axis 63 of the drum 60. The lens 58 vertically and laterally reverses the light beams or images reflected from the original 32. The photosensitive drum 60 is prepared by applying selenium by vapor deposition to the surfaces of a cylindrical member formed of a metallic conductor material such as aluminum or copper. The drum 60 is rotated about the axis 63 clockwise as viewed FIG. 1 at a peripheral speed equal to a speed of the displacement of the support 26. A corotron 62 is disposed adjacent to the drum surface 61 at a location prior to the top of drum 60, namely the exposure zone, as viewed in a rotating direction B of the drum 60. The corotron 62 uniformly electrically charges the drum surface 61. As the drum 60 is rotated, the leading area of the uniformly charged portion of the drum surface 61 comes to the top of the drum 60 and is exposed in the exposure zone to the light beams or images reflected from the original 32 which concurrently is displaced in the copying direction. Upon exposure to reflected light beams or images, the uniformly charged drum surface 61 is locally discharged through the underlying conductor material, or locally not discharged, depending upon the intensities of the light beams or images. Thus, the drum surface 61 is imagewise exposed according to the source image information or images on the original 32, so that electrostatic latent images corresponding to the original images are formed on the drum surface 61.

The coating device 12 also includes a developer-material coating means 66 and a microcapsules coating means 68 which are disposed adjacent to the drum surface 61 at respective locations in the above-described order following the exposure zone as viewed in the rotating direction B of the drum 60. The developer-material coating means 66 applies a developer material 74 to the drum surface 61, while the microcapsules coating means 68 applies photosensitive microcapsules 76 to the drum surface 61. The coating means 66, 68 include feeders 70, 72 for feeding the developer material 74 and the microcapsules 76, respectively.

The microcapsules 76 are in a solid condition at ordinary temperature, and enclose a photosensitive resin having a photosensitivity wherein its physical property is varied by light, a chromogenic material or color precursor as a coloring material, a polymerization initiator, etc., which will be hereinafter described in detail.

Figure 4:
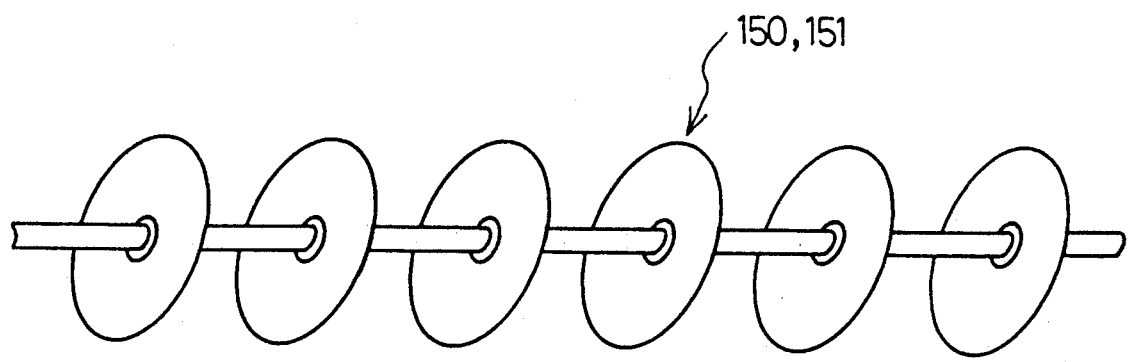
FIG. 4 is a perspective view of a stirring roller usable with the present invention.

The developer material 74 chemically reacts with the chromogenic material released from each microcapsule 76 when ruptured to develop a color. The microcapsules 76 include three kinds of capsules corresponding to three colors. Thus, a color copy of the color-image original 32 can be produced. More specifically, the microcapsules 76 include capsules C which are cured upon exposure to red light, capsules M which are cured upon exposure to green light, and capsules Y which are cured upon exposure to blue light. Each capsule C, M, Y is cured, or not cured, upon exposure to light depending upon the color and intensity of the light. Thus, microcapsule-based latent images corresponding to the color images on the original 32 can be formed on the microcapsules 76. The microcapsules 76 constituting the microcapsule-based latent images are ruptured, or not ruptured, depending upon the degrees of hardness thereof, so that the microcapsule-based latent images are developed into color images. These color images have the same colors and tones as those of the original color images. The developer-material and microcapsules feeders 70, 72 have rollers 78, 80, respectively, each of which is rotatable counterclockwise about an axis parallel to the rotation axis 63 of the drum 60. The developer material 74 and the microcapsules 76 are applied to the drum surface 61 as the rollers 78, 80 are rotated, respectively. The materials 74, 76 are frictionally charged by stirring rollers 150, 151 (shown in FIG. 4) with a sign (positive or negative) opposite to a sign (negative or positive) of the drum surface 61. Each material 74, 76 is adhered to the drum surface 61 by electrostatic attraction or Coulomb's attraction according to the electrostatic latent images.

A corotron 82 is disposed adjacent to the drum surface 61 at a location diametrically opposite to the exposure zone directly below the lens 58. The corotron 82 electrically charges a recording medium in the form of a copy sheet 90 with a sign opposite to the sign of the developer material and microcapsules 74, 76. This permits the developer material 74 and microcapsules 76 to be easily transferred from the drum surface 61 to the copy sheet 90. Thus, each material 74, 76 is applied to the copy sheet 90 according to the source image information or images on the original 32. A discharger 88 is disposed adjacent to the drum surface 61 at a location between the transfer position (or the corotron 82) and the corotron 62. The discharger 88 entirely discharges the drum surface 61 through the underlying conductor material.

The sheet feeding device 14 for feeding the copy sheet 90, is provided at the right-hand bottom of the housing 24 as viewed in FIG. 1. An ordinary cut sheet is used as the copy sheet 90. The sheet feeding device 14 includes a case 92 for feeding out the copy sheets 90 one by one. The copy sheet 90 fed out of the case 92 is subsequently conveyed by a pair of rollers 96, 96 to the transfer position between the drum 60 and the corotron 82. The rollers 96, 96 are rotated by a drive motor (not shown) at a peripheral speed equal to the peripheral speed of the drum 60 and the displacement speed of the support 26.

The copy sheet 90 having thereon the transferred developer material and microcapsules 74, 76, are further fed by another pair of rollers 98, 98 toward the exposing device 16. A heater 141 is provided under the feeding path of the copy sheet 90. The heater 141 serves to heat the microcapsules 76 on the copy sheet 90 and soften the solidified microcapsules 76.

The exposing device 16 is provided on the downstream side of the partition wall 48 as viewed in the copying direction. The exposing device 16 includes a lamp 102 serving as a light source. The lamp 102 has a configuration similar to the lamp 52 of the exposing means 50 of the coating device 12. The lamp 102 has an elongate shape, and its longitudinal axis extends perpendicular to the copying direction. The exposing device 16 further includes a screen 106 which is provided in front of the lamp 102 and has an elongate slit 104 formed therethrough with a predetermined width. Thus, the exposing device 16 irradiates an irradiation zone on the imaged surface of the original 32 such that the irradiation zone has a suitable width and extends normally to the copying direction. This irradiation zone is different, and separate from the irradiation zone irradiated by the lamp 52 or the exposing means 50 of the coating device 12. The light beams or images reflected from the original 32 are converged by a lens 108, and the direction of the converged light beams is changed by a first, a second and a third reflection mirror 110, 112, 113 one after another, so that the reflected light beams are incident to the copy sheet 90 at a position (hereinafter referred to as the exposing position) apart by a predetermined distance from the irradiation zone (irradiated by the lamp 102) in the reverse direction. The reason why the radiation zone and the exposing position are spaced apart from each other by the predetermined distance will be described later. The lens 108 laterally and vertically reverses the light beams or images reflected from the original 32, like the lens 58. Thus, the copy sheet 90 having thereon the microcapsules 76 is image-wise exposed according to the source image information or color images on the original 32, so that microcapsule-based latent images are formed on the copy sheet 90.

The exposed copy sheet 90 is further fed by two pairs of rollers 120, 120 and 122, 122 to the developing device 18. A heater 143 is provided above the feeding path of the copy sheet 90. The heater 143 serves to heat the microcapsules 76 on the copy sheet 90 and soften the microcapsules 76 not photo-cured.

The developing device 18 includes a pair of presser rollers 124, 126 which provide a nip for applying a pressure to the copy sheet 90 as copy sheet 90 is fed therebetween. The presser rollers 124, 126 are rotated together with rollers 98, 98, 120, 120, 122, 122 at a peripheral speed equal to that of the rollers 96, 96, by the previously-described drive motor associated with the rollers 96, 96. After the application of the developing pressure to the copy sheet 90, the copy sheet 90 is fed to the fixing device 20. The fixing device 20 includes a heater 140 for heating the copy sheet 90 for fixation. After the fixation the copy sheet 90 is fed by a pair of rollers 142, 142 into a receiving tray 144 where the operator or user takes the copy sheet 90 as a copy of the original 32.

Figure 3:
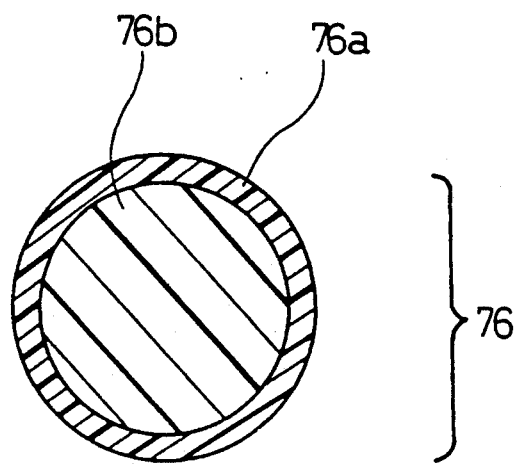
FIG. 3 is an enlarged view of the microcapsule.

There will now be described the details of the microcapsules 76. FIG. 3 is an enlarged view of a microcapsule 76. The microcapsule 76 is composed of an outer shell 76a and a core 76b. The core 76b contains a photosensitive resin solidified at 36° C. or less, a chromogenic material, or color precursor etc. A suitable example of the photosensitive resin may include a polymerizable monomer or oligomer. In general, a conventional monomer or oligomer is in a liquid condition at ordinary temperature. However, as the result of investigation by the present inventor, it has been found that a monomer or oligomer having a melting point of 30°–150° C. can be obtained by containing a cyclohexyl acid, isocyanate acid or urethane coupling in a molecular structure. This monomer or oligomer exhibits excellent characteristics in reactivity and weatherability.

Examples of the monomer or oligomer having a melting point of 30°–150° C. which are usable in the present invention may include epoxy acrylate (m.p.: 60° C.) to be synthesized by the reaction of bisphenol A epoxy resin ($\overline{Xn}=2900$) with acrylic acid, or epoxy acrylate (m.p.: 90° C.) to be synthesized by the reaction of bisphenol A epoxy resin ($\overline{Xn}=2900$) with methacrylic acid.

Examples of the monomer or oligomer having a cyclohexyl ring in the molecular structure and having a melting point of 30°–150° C. may include epoxy acrylate (m.p.: 70° C.) to be synthesized by the reaction of hydroxylated bisphenol A epoxy resin ($\overline{Xn}=3000$) with methacrylic acid.

Examples of the monomer or oligomer having an isocyanate ring in the molecular structure and having a melting point of 30°–150° C. may include tris-2-methacryloxy isocyanurate (m.p.: 80° C.) or trimethallyl isocyanurate (m.p.: 86° C.).

Examples of the monomer or oligomer having a urethane coupling in the molecular structure and having a melting point of 30°–150° C. may include urethane acrylate (m.p.: 90° C.) to be synthesized by the reaction of 4,4'-diphenylmethane diisocyanate with 2-hydroxyethyl acrylate, or urethane acrylate (m.p.: 130° C.) to be synthesized by the reaction of 4,4'-diphenylmethane diisocyanate with 2-hydroxyethyl methacrylate.

The monomer or oligomer having a cyclohexyl acid and a urethane coupling in the molecular structure and having a melting point of 30°–150° C. is also effective. Examples of this monomer or oligomer may include urethane acrylate (m.p.: 150° C.) to be synthesized by the reaction of 1,4-cyclohexylene diisocyanate with 2-hydroxyethyl acrylate, urethane acrylate (m.p.: 110° C.) to be synthesized by the reaction of 1,4-cyclohexylene diisocyanate with 2-hydroxypropyl acrylate, or urethane acrylate (m.p.: 90° C.) to be synthesized by the reaction of 4,4'-dicyclohexylmethane diisocyanate with 2-hydroxyethyl methacrylate.

On the other hand, examples of the chromogenic material or color precursor contained in the core 76b of the microcapsule 76 which are usable in the present invention may include triaryl methane compound, diphenyl methane compound, xanthene compound, thiazine compound, or spiro compound.

Examples of the triaryl methane compound may include 3,3-bis(P-dimethylaminophenyl)-6-dimethylaminophthalide, 3,3-bis(P-dimethylaminophenyl)-phthalide, or 3-(P-dimethylamino-phenyl)-3-(1,2-dimethylindole-3-yl)-phthalide.

Examples of the diphenyl methane compound may include 4,4'-bisdimethylaminobenzhydrine benzile ether.

Examples of the xanthene compound may include 3-dimethylamino-7-methoxyfluorane, 3-dimethylamino-7-chlorofluorane, or 3-diethylamino-7-dibenzilaminofluorane.

Examples of the thiazine compound may include benzoyl leuco methylene blue.

Examples of the spiro compound may include 3-methylspiro-dinaphtopyran and 3-propyl-spiro-dibenzopyran.

The core 76b of the microcapsule 76 further contains a photopolymerization initiator for polymerizing the photosensitive resin and a photosensitizer auxiliary for expanding a sensitizing wavelength range of the photopolymerization initiator.

Examples of the photopolymerization initiator to be employable may include benzoinalkyl ether, benzophenone, Michler's ketone, thioxanthone, and acetophenone.

Examples of the photosensitizer auxiliary to be employable may include anthraquinone or 5-nitrofluorene.

Examples of the developer material 74 for coloring the chromogenic material or color precursor may include an inorganic acidic substance such as acid clay, activated clay, kaolin, zeolite or bentonite; substituted phenol compound such as P-cresol, P-octylphenol, P-cyclohexylphenol, P-phenylphenol, α-naphtylphenol, cumylphenol or P-chlorophenol; phenol resin compound such as phenol formalin condensate or substituted phenol formalin condensate; metal salt modified phenol resin compound to be obtained by modifying the phenol resin compound with a multivalent metal such as zinc or nickel; aromatic carboxylic acid compound such as P-butylbenzoic acid, P-hydroxybenzoic acid, 2,5-dihydroxybenzoic acid, salicylic acid, 5-tert-butylsalicyclic acid, 3,5-di-tert-butylsalicylic acid or 3,5-di-($\alpha$-methylbenzil)salicylic acid; metal salt of the aromatic carboxylic acid compound to be obtained by substituting the aromatic carboxylic acid compound with a multivalent metal such as zinc or nickel; or a mixture of the aromatic carboxylic acid compound with a multivalent metal compound such as zinc acetate or zinc propionate.

The microcapsules to be employable in the preferred embodiment may be produced by known methods in this field such as a method of phase separation from an aqueous solution as disclosed in U.S. Pat. Nos. 2,800,457 and 2,800,458, an interfacial polymerization method as disclosed in Japanese Patent Publication Nos. 38-19574, 42-446 and 42-771, an in-situ method by polymerization of monomer as disclosed in Japanese Patent Publication No. 36-9168 and Japanese Patent Laid-Open No. 51-9079, a dispersion cooling method as disclosed in British Patent Nos. 952,807 and 965,074, or a spray drying method as disclosed in U.S. Pat. No. 3,111,407 and British Patent No. 930,422. However, the producing method of the microcapsules according to the present invention is not limited to these known methods.

Examples of the material for forming the outer shell 76a of the microcapsule 76 may include gelatin, gum Arabic, starch, sodium alginate, ethyl cellulose, carboxyethyl cellulose, polyvinyl alcohol, polyethylene, polyamide, polyester, polyurethane or polyethyleneimine. It is preferable that these materials should sufficiently transmit light, especially ultraviolet light.

There will be described the operation of the copying machine constructed as described above. At the start of a copying operation, the support 26 is at its start position, and the radiation zone irradiated by the exposing means 50 of the coating device 12 is located on the downstream-side end of the support 26 as viewed in the copying direction. First, an original 32 bearing source image information or color images is set on the support 26, and the cover 30 is put over the original 32. Upon operation of a start switch (not shown), the photosensitive drum 60 is rotated, and the drum surface 61 is uniformly charged by the corotron 62. When the leading area of the uniformly charged portion of the drum surface 61 comes to the top of the drum 60 directly below the lens 58, the displacement of the support 26 in the copying direction commences, and the lamp 52 irradiates the irradiation zone on the original 32 which concurrently is displaced in the copying direction. The light beams or images reflected from the original 32 expose the exposure zone on the drum surface 61 at the top of the drum 60 as the drum 60 is rotated, thereby image-wise exposing the drum surface 61 according to the source image information or images on the original 32. Thus, electrostatic latent images are formed in the drum surface 61. Since the displacement speed of the support 26 and the peripheral speed of the drum 60 are equal to each other, the electrostatic latent images formed in the drum surface 61 are free from deformation or distortion as compared with the original images. This is a first exposure of the drum surface 61. At the beginning of this first exposure the developer-material coating means 66 is placed in its operative mode, while the microcapsules coating means 68 remains in its inoperative mode. The developer-material coating means 66 is operated to apply the developer material 74 to the drum surface 61 according to the electrostatic latent images, namely, the original images. Thus, the developer material 74 applied or adhered to the drum surface 61 provides the developer-material images corresponding to the original images.

The thus formed developer-material images are transferred from the drum surface 61 to a copy sheet 90 at the transfer position where the corotron 82 is disposed. The copy sheet 90 is fed from the case 92 to the transfer position such that, when the leading area of the exposed portion of the drum surface 61 (this area is also the leading area of the uniformly charged portion) comes to the transfer position, the downstream-side end of the copy sheet 90 as viewed in the copying direction just comes to the transfer position. Thus, the developer-material images are transferred from the drum surface 61 to the copy sheet 90 as the drum 60 and the copy sheet 90 are rotated and fed at the same speeds, respectively.

After the electrostatic latent images have been formed in the drum surface 61 according to the whole source image information on the original 32, the support 26 is returned in the reverse direction to its start position. In addition, after the developer-material images have been transferred at the transfer position from the drum surface 61 to the copy sheet 90, the drum surface 61 is discharged by the discharger 88 as the drum 60 is rotated. Unless the drum surface 61 is discharged, the electrostatic latent images formed by the first exposure remain in the drum surface 61 and consequently the drum surface 61 cannot uniformly be charged by the corotron 62 in the next charging operation. This will cause a significant difference between the amount of the developer material 74 adhered to the drum surface 61 and that of the microcapsules 76 adhered to the same 61. After the developer material 74 has been adhered to the drum surface 61 according to the entire electrostatic latent images, and the entire developer-material images are transferred from the drum surface 61 to the copy sheet 90, the rotation of the drum 60 is stopped and the developer-material coating means 66 is placed in its inoperative position. At this point of time the upstream-side end of the copy sheet 90 is located at the transfer position. After the rotation of the drum 60 has been stopped, the copy sheet 90 is returned in the reverse direction so that the downstream-side end of the copy sheet 90 is located at a position apart by a small distance upstream from the transfer position.

Figure 2:
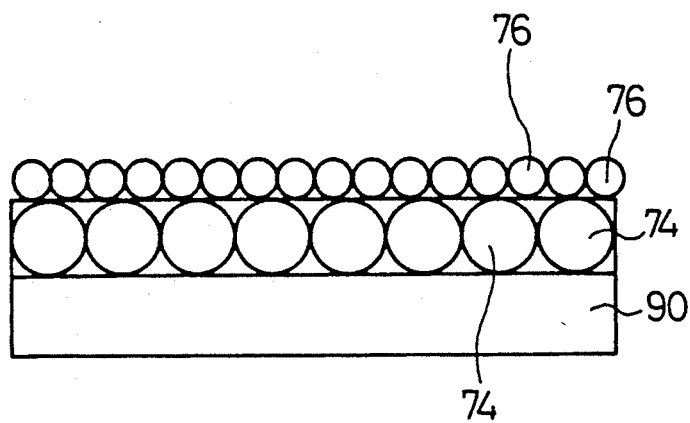
FIG. 2 is an explanatory view illustrating the developer material and microcapsules applied in double layers to a copy sheet by a coating device of the copying machine of FIG. 1.

After the downstream-side end of the copy sheet 90 has been returned to the above-described position on the upstream side of the transfer position, the rotation of the drum 60 is restarted and the drum surface 61 is uniformly charged by the corotron 62. When the leading area of the uniformly charged portion of the drum surface 61 comes to the top of the drum 60, namely, the exposure zone, the support 26 is re-displaced from its start position in the copying direction, and the drum surface 61 is again image-wise exposed according to the source image information on the original 32. Thus, electrostatic latent images are formed in the drum surface 61. This is the second exposure of the drum surface 61. At the beginning of the second exposure, the microcapsules coating means 68 is placed in its operative position. Thus, the microcapsules 76 are adhered to the drum surface 61 according to the newly formed electrostatic latent images. The microcapsule images formed on the drum surface 61 correspond to the original images. The copy sheet 90 is fed to the transfer position as in the previous time, namely, such that when the leading area of the exposed portion of the drum surface 61 comes to the transfer position, the downstream-side end of the copy sheet 90 just comes to the transfer position. Thus, the microcapsule-material images are transferred from the drum surface 61 to the copy sheet 90 such that the microcapsules-material images are superposed on the developer-material images with precision, namely, without any dislocation therebetween. Thus, the developer-material images and the microcapsules-material images, each corresponding to the original images, are provided in double layers in the above-described order on the copy sheet 90 as shown in FIG. 2. After the transfer of the microcapsules images to the copy sheet 90, the rotation of the drum 60 is stopped and the microcapsule coating means 68 is placed in its inoperative mode.

The displacement of the copy sheet 90 in the copying direction is further continued after the transfer of the microcapsules images. That is, the copy sheet 90 is fed toward the previously described exposing position on the downstream-side of the partition wall 48 as viewed in the copying direction. At this time, the copy sheet 90 is heated by the heater 141 before reaching the exposing position.

By heating the microcapsules 76 by the heater 141 before exposure, the core 76b of the microcapsule 76 is once liquified. Therefore, curing of the microcapsules proceeds quickly at the time of exposure, and the sensitivity is greatly increased as compared with the case where heating is not carried out.

At the exposing position, the copy sheet 90 is imagewise exposed by the exposing device 16 according to the source image information or color images on the original 32. Also, the displacement of the original 32 or support 26 in the copying direction is continued after the second exposure of the drum surface 61. Therefore, the original 32 and the copy sheet 90 are displaced in the copying direction while being spaced from each other by a distance equal to half the circumferential length of the drum 60. The exposing device 16 is designed such that the exposing position and the irradiation zone irradiated by the lamp 102 are apart from each other by the above-indicated distance equal to half the circumferential length of the drum 60. The direction of the light beams or images reflected from the original 32 is changed by the first, second and third mirrors 110, 112, 113, and the reflected light beams or images are incident to the copy sheet 90 at the exposing position. Thus, the microcapsule images on the copy sheet 90 are imagewise exposed according to the source image information or color images on the original 32, as if the original color images were superposed on the microcapsule images without any dislocation therebetween. As a result, microcapsule-based latent images are formed on the copy sheet 90. Although the original 32 and the copy sheet 90 are fed in the copying direction with the above-indicated distance therebetween, it is however not necessary to stop the displacement of the original 32 so as to await the copy sheet 90 to arrive at a position directly below the irradiation zone irradiated by the lamp 102. Thus, the displacements of the original 32 and the copy sheet 90 are easily controlled.

Thus, the copy sheet 90 is exposed by a reflected light from the original 32, and each microcapsule 76 is selectively cured. More specifically, the microcapsules 76 containing the chromogenic material or color precursor to be colored in cyan with respect to a red light are cured; the microcapsules 76 containing the chromogenic material or color precursor to be colored in magenta with respect to a green light are cured; and the microcapsules 76 containing the chromogenic material or color precursor to be colored in yellow with respect to a blue light are cured. These microcapsules 76 cured by the exposure remain hard even when they are heated again by the heater 143, and they are not ruptured by the pressure of the pressure developing device 18. However, when the other microcapsules (the non-cured microcapsules) 76 are heated again by the heater 143, the core 76b is liquified softened microcapsules 76 are ruptured by the pressure of the pressure developing device 18.

As a result, the chromogenic material or color precursor released from each ruptured capsule chemically reacts with the developer material 74, and thereby develops a corresponding color. Thus, color images are developed on the copy sheet 90. These color images have the same colors and tones as those of the corresponding color images on the original 32. In addition, since the microcapsule images are superposed on the developer-material images on the copy sheet 90, the exposure of the microcapsule images is not interfered with even when the developer material 74 is opaque and therefore does not transmit light or radiation. After the application of the developing pressure, the copy sheet 90 is heated by heater 140 of the fixing device 20 and then is further fed into the receiving tray 144.

As is apparent from the foregoing, in the illustrated embodiment, the microcapsules 76 are hardened at ordinary temperature. Therefore, undue rupture of the microcapsules 76 can be eliminated, thereby stabilizing the image formation. Furthermore, the replenishment or the like of the microcapsules can be easily facilitated.

In addition, the coating device 12 applies the developer material 74 and the microcapsules 76 to the copy sheet 90. Therefore, any kind of recording medium may be used as the copy sheet 90 in the copying machine.

In addition, the coating device 12 applies the developer material 74 and the microcapsules 76 to the drum 60 according to the source image information or images on the original 32, and transfers the developer-material images and the microcapsule images from the drum 60 to the copy sheet 90. Therefore, the amount of developer material 74 and microcapsules 76 used is reduced as compared with the conventional recording machine in which the developer material, or both the developer material and the microcapsules, is/are applied to the entire surface of a recording medium. Accordingly the cost of production per copy is reduced.

In the case that the developer material 74 and the microcapsules 76 are deposited onto the drum surface 61 as in the above-mentioned preferred embodiment, an image corresponding to the original image may be formed on the drum surface 61 by either of the developer material 74 or the microcapsules 76, while the other may be uniformly coated onto the drum surface 61. In this case, the order of coating of the microcapsules 76 and the developer material 74 onto the drum surface 61 may be appropriate depending on the transparency or opaqueness of the developer material. Further, the transferring of the microcapsules 76 and the developer material 74 from the drum surface 61 to the copy sheet 90 may be carried out individually or collectively after the developer material 74 and the microcapsules 76 are coated onto drum surface 61. When the developer material 74 and the microcapsules 76 are collectively transferred from the drum surface 61 to the copy sheet 90, the number of times of the transferring can be reduced, and a copying time can be accordingly reduced. However, in the case that the developer material 74 is opaque, it is necessary to transfer the developer material 74 in such a manner that the developer material 74 underlies the microcapsules 76.

Further, an image corresponding to the original image may be formed on the drum surface 61 by either of the developer material 74 or the microcapsules 76, and the other may be coated directly uniformly onto the copy sheet 90.

In another case, no image may be formed on the drum surface 61, and both the developer material 74 and the microcapsules 76 may be uniformly coated onto the copy sheet 90. In this case, a supporting body may be used, and the developer material 74 and the microcapsules 76 may be deposited onto the supporting body as charged. Then, the developer material 74 and the microcapsules 76 may be transferred to the copy sheet 90. Alternatively, the developer material 74 and the microcapsules 76 may be transferred to the copy sheet 90. Alternatively, the developer material 74 and the microcapsules 76 may be coated directly onto the copy sheet 90.

Further, in the case that an opaque developer material 74 is coated directly uniformly onto the copy sheet 90, it may be coated onto the microcapsules 76 if an image by the microcapsules 76 coated on the copy sheet 90 has not yet been developed after exposure.

In addition, although the developer material 74 and the microcapsules 76 are stored in the individual cases 70 and 72, respectively, so as to form individual electrostatic latent images on the drum surface 61 in the above-mentioned preferred embodiment, the developer material 74 and the microcapsules 76 may be stored in a single common case to carry out the formation of the electrostatic latent image on the drum surface 61 only once, so that a copying time may be accordingly reduced. Simultaneously, the necessity of registering the developer material image with the microcapsule image can be eliminated, thereby effectively making the control more simple.

The present invention may be applied not only to a copying machine but also to any apparatus for exposing microcapsules according to image data and recording the image. The exposing device may be disposed on the photosensitive drum 60. The heating position of the microcapsules 76 may be both the exposing position and the pressing position of the pressure developing device 18, or it may be only the pressing position or a position just before the pressing position.

Although the above-described embodiment utilizes microcapsules containing a chromogenic material or color precursor that reacts with a developer material, a microcapsule containing, for example, paint or a pigment as a coloring material may also be used. It is understood that a developer material is not required when paint or a pigment is used as a coloring material.

Although not mentioned in detail, the present invention may be embodied in various modes to be modified and improved on the basis of knowledge of those skilled in the art.

What is claimed is:

1. An image forming apparatus for forming visible images on a recording medium according to source image information, comprising:
   microcapsules each of which includes a coloring material and a material having a heat-softening property wherein it is softened by heat and a photo-curing property wherein it is cured by light;
   a coating device for coating said microcapsules onto the recording medium;
   an exposing device for exposing said microcapsules to a radiation having the source image information, so as to selectively cure the microcapsules according to the source image information;
   a heating device for heating said microcapsules so as to soften said microcapsules; and
   a pressure developing device for pressing the recording medium so as to rupture said softened microcapsules on the recording medium, whereby the visible images are formed on the recording medium.

2. The image forming apparatus according to claim 1, wherein said heating device heats said microcapsules before said microcapsules are pressed by said pressure developing device.

3. The image forming apparatus according to claim 1, wherein said heating device heats said microcapsules when said microcapsules are pressed by said pressure developing device.

4. The image forming apparatus according to claim 1, wherein said heating device heats said microcapsules before said microcapsules are exposed by said exposing device.

5. The image forming apparatus according to claim 1, wherein said heating device heats said microcapsules when said microcapsules are exposed by said exposing device.

6. The image forming apparatus according to claim 1, wherein said material having a heat-softening property has a melting point in the range of 30° C. to 150° C.

7. The image forming apparatus according to claim 6, wherein said material having a heat-softening property includes an epoxy acrylate.

8. The image forming apparatus according to claim 6, wherein said material having a heat-softening property includes a monomer or oligomer selected from the group consisting of tris-2-methacryloxy isocyanurate and trimethallyl isocyanurate.

9. The image forming apparatus according to claim 6, wherein said material having a heat-softening property includes urethane acrylate.

10. The image forming apparatus according to claim 1, wherein said coloring material is selected from the group consisting of triaryl methane compounds, diphenyl methane compounds, xanthene compounds, thiazine compounds and spiro compounds.

11. The image forming apparatus according to claim 1, wherein said material having a heat-softening property is solid at ambient temperature prior to being cured.

12. The image forming apparatus according to claim 1, wherein said coating device includes:
   charging means for frictionally charging said microcapsules, and
   transferring means for transferring said microcapsules to the recording medium.

13. The image forming apparatus according to claim 12, wherein said charging means is a stirring roller.

14. The image forming apparatus according to claim 1, wherein said coloring material is a chromogenic material which chemically reacts with a developer material to form an image.

15. An image forming apparatus for forming visible images on a recording medium according to source image information, comprising:

microcapsules each of which includes a coloring material and a material having a heat-softening property wherein it is softened by heat and a photocuring property wherein it is cured by light;

charging means for frictionally charging said microcapsules;

transferring means for transferring said microcapsules to the recording medium;

an exposing device for exposing said microcapsules to a radiation having the source image information, so as to selectively cure said microcapsules according to the source image information;

a heating device for heating said microcapsules so as to soften said microcapsules; and a pressure developing device for pressing the recording medium so as to rupture the softened microcapsules on the recording medium, whereby the visible images are formed on the recording medium.

16. The image forming apparatus according to claim 15, wherein said coloring material is a chromogenic material and further comprising:

a developer material which chemically reacts with said chromogenic material of said microcapsules, whereby said charging means frictionally charges said microcapsules and said developing material and said transferring means transfers said microcapsules and said developing material to the recording medium.

17. The image forming apparatus according to claim 15, further comprising:

an electrostatic body having an electrically chargeable surface, the electrically chargeable surface permitting electrostatic latent images to be formed therein according to the source image information; and coating means for coating said charged microcapsules onto said electrically chargeable surface of said electrostatic body according to the electrostatic latent images, whereby said transferring means transfer said microcapsules from said electrically chargeable surface to the recording medium.

18. A method of forming an image on a recording medium comprising:

coating a surface of the recording medium with a plurality of microcapsules, said microcapsules including a coloring material and a material having a heat-softening property wherein it is softened by heat and a photo-curing property wherein it is cured by light;

exposing said microcapsules to a radiation having a source image information, so as to selectively cure said microcapsules according to the source image information;

heating said microcapsules so as to soften said microcapsules; and rupturing said softened microcapsules on the recording medium, whereby visible images are formed on the recording medium.

19. The method according to claim 18, wherein said heating is performed before said rupturing.

20. The method according to claim 18, wherein said heating is performed when said rupturing is performed.

21. The method according to claim 18, wherein said heating is performed before said exposing.

22. The method according to claim 18, wherein said heating is performed when said exposing is performed.

23. The method according to claim 18, wherein said coating includes:

frictionally charging said microcapsules; and transferring said microcapsules to the recording medium.

24. The method according to claim 18, wherein said heating heats said microcapsules to a temperature in the range between 30° C. and 150° C.

25. The method according to claim 18, wherein said material having a heat-softening property is solid at ambient temperature prior to being cured.

26. The method according to claim 18, wherein said coloring material is a chromogenic material which chemically reacts with a developer material to form an image.

* * * * *